United States Patent
Miyake et al.

(10) Patent No.: US 7,274,200 B2
(45) Date of Patent: Sep. 25, 2007

(54) SEMICONDUCTOR CIRCUIT, METHOD OF MONITORING SEMICONDUCTOR-CIRCUIT PERFORMANCE, METHOD OF TESTING SEMICONDUCTOR CIRCUIT, EQUIPMENT FOR TESTING SEMICONDUCTOR CIRCUIT, AND PROGRAM FOR TESTING SEMICONDUCTOR CIRCUIT

(75) Inventors: Hiroshi Miyake, Kawasaki (JP); Noriyuki Tokuhiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/019,238

(22) Filed: Dec. 23, 2004

(65) Prior Publication Data

US 2006/0043999 A1    Mar. 2, 2006

(30) Foreign Application Priority Data

Aug. 30, 2004  (JP)  ............................. 2004-250782

(51) Int. Cl.
*G01R 31/02*  (2006.01)

(52) U.S. Cl. .................. 324/763; 324/765; 714/733; 714/734; 368/107

(58) Field of Classification Search ............... 324/763, 324/765; 368/107; 714/733, 734; 340/657; 331/57
See application file for complete search history.

(56) References Cited

U.S. PATENT DOCUMENTS

| | | | | |
|---|---|---|---|---|
| 5,675,274 A | * | 10/1997 | Kobayashi et al. ......... 327/158 |
| 5,920,518 A | * | 7/1999 | Harrison et al. ............ 365/233 |
| 6,437,553 B1 | * | 8/2002 | Maloney et al. ......... 324/76.35 |
| 6,476,594 B1 | * | 11/2002 | Roisen .................... 324/76.54 |
| 6,486,651 B1 | * | 11/2002 | Lee et al. ................ 324/76.53 |
| 6,493,829 B1 | * | 12/2002 | Kubo ........................ 713/500 |
| 6,518,807 B1 | * | 2/2003 | Cho ........................... 327/158 |
| 6,727,734 B2 | * | 4/2004 | Gomm ....................... 327/156 |
| 6,759,911 B2 | * | 7/2004 | Gomm et al. ................ 331/10 |
| 6,861,886 B1 | * | 3/2005 | Ludden et al. ............. 327/156 |
| 6,985,401 B2 | * | 1/2006 | Jang et al. ................. 365/233 |
| 7,075,285 B2 | * | 7/2006 | Chin ....................... 324/76.54 |
| 2002/0047742 A1 | | 4/2002 | Setogawa |
| 2002/0180500 A1 | | 12/2002 | Okuda et al. |

FOREIGN PATENT DOCUMENTS

JP    2003-273728    9/2003

* cited by examiner

*Primary Examiner*—Ha Tran Nguyen
*Assistant Examiner*—Arleen M. Vazquez
(74) *Attorney, Agent, or Firm*—Arent Fox LLP

(57) ABSTRACT

A semiconductor circuit is disclosed, including a DLL circuit for supplying a desired signal-delay amount. The DLL circuit includes detecting means for detecting variations of a signal-delay amount, and delay-amount control means for generating a delay-amount control signal for controlling, depending on the variations of the signal-delay amount detected by the detecting means, the signal-delay amount of the DLL circuit. The semiconductor circuit further includes a part for monitoring circuit performance of the semiconductor circuit based on the delay-amount control signal.

5 Claims, 8 Drawing Sheets

FIG.3

| CONDITION | PROCESS VARIATION | TEMPERATURE | POWER SUPPLY VOLTAGE |
|---|---|---|---|
| Fast | Pfast | Tmin | Vmin |
| Typical | Ptyp | Ttyp | Vtyp |
| Slow | Pslow | Tmax | Vmax |

SEMICONDUCTOR CIRCUIT, METHOD OF MONITORING SEMICONDUCTOR-CIRCUIT PERFORMANCE, METHOD OF TESTING SEMICONDUCTOR CIRCUIT, EQUIPMENT FOR TESTING SEMICONDUCTOR CIRCUIT, AND PROGRAM FOR TESTING SEMICONDUCTOR CIRCUIT

BACKGROUND OF THE INVENTION

1. Field of the Invention

The present invention generally relates to a technology for monitoring and testing the performance of a semiconductor circuit, and particularly relates to a method of monitoring and testing the circuit performance of a semiconductor circuit including a DLL (Delayed Locked Loop) circuit.

2. Description of the Related Art

In a semiconductor circuit, e.g. a CMOS LSI circuit, high-precision data processing is called for in a memory interface, such as a so-called DDR (Double-Data Rate), for which a high-speed and accurate data transfer is required. On the other hand, with a scaling down of the semiconductor circuit process in recent years, a trend for an increased amount of process variations is seen. As such process variations have a great impact on the performance of the LSI circuit such as the operation speed or the power consumption, monitoring the process (process monitoring) and screening the CMOS are performed for the purpose of ensuring that the amount of process variations of the LSI circuit is contained within a predetermined value.

In general, for the process monitoring and the product screening of the CMOS LSI, there are such techniques as measuring the amount of current at P and N channels of transistors configuring the LSI circuit concerned, and having embedded a ring oscillator in the LSI circuit so as to measure the oscillating frequency of this ring oscillator, etc.

Figure 1A:
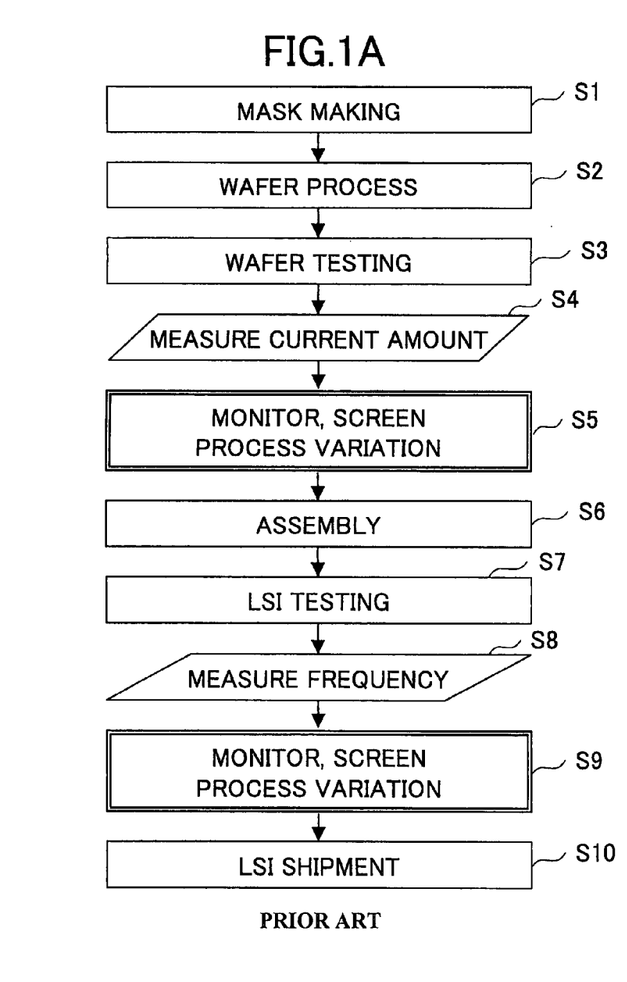
FIG. 1A and FIG. 1B are diagrams for describing one exemplary prior-art method of testing and screening a semiconductor circuit.
Figure 1B:
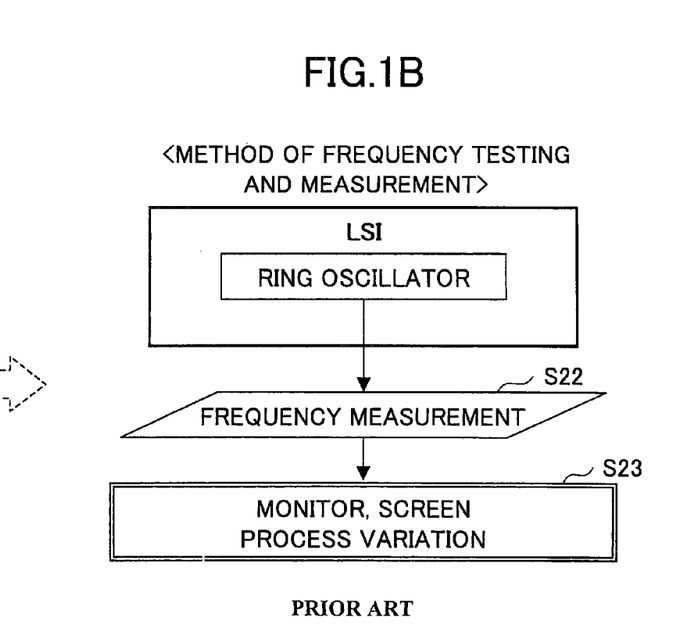

FIG. 1A and FIG. 1B are diagrams for describing one exemplary prior-art process monitoring technique.

In FIG. 1A, a mask for an LSI-manufacturing method is manufactured in step S1, a wafer is manufactured in step S2, and the wafer is tested in step S3. Then the current amount of the semiconductor circuit manufactured is measured in step S4, and process-variation monitoring and product screening is performed in step S5. The circuit performance of the semiconductor circuit is analyzed from the current amount measured in step S4 so as to collate the analyzed performance with product-shipment standards for discarding an out-of-spec product.

Then, for within-spec products from step S5, assembling of the LSI circuit is performed in step S6, and for the assembled LSI circuit, product testing is performed in step S7. Then in step S8, frequency measurement is performed separately from the product testing in step S7. Here, as illustrated in FIG. 1B, the frequency of an oscillating signal obtained from the ring oscillator being pre-embedded in the LSI circuit (step S22) is measured. Then, based on the measurement results, the performance of the semiconductor circuit, or the process variation, is analyzed so as to collate the analyzed results with the product shipment standards for discarding out-of-spec products. Thus, the performance of a product is evaluated so as to determine whether the products can be shipped out (Step 9). If yes, the LSI circuit concerned is shipped in step S10.

Patent Document 1
JP2003-273728A

However, with such a prior-art technique, it is conceivable that the following problems arise:

1) The current amount (Ids) data at the P and the N channels of a transistor are often handled as data confidential to the manufacturer of the semiconductor so that often it is difficult for the user purchasing the LSI circuit to obtain the data.

2) It is difficult to derive from the current amount of the transistor the actual operating frequency range for each individual LSI circuit associated with the current amount.

3) For the technique of monitoring and screening by the ring oscillator that results in speed testing for monitoring the frequency, the testing is prone to measurement error, and moreover, when the oscillating frequency exceeds the measurement limit of a LSI tester at the user side, it is necessary to divide the output of the ring oscillator. Thus, when having divided the output of the ring oscillator, a decrease in the measurement precision cannot be avoided.

SUMMARY OF THE INVENTION

It is a general object of the present invention to provide a technology for monitoring and testing the performance of a semiconductor circuit that substantially obviates one or more problems caused by the limitations and disadvantages of the related art.

It is a more particular object of the present invention to provide for, within a DLL circuit being embedded in a semiconductor circuit, evaluating of the circuit performance of the semiconductor circuit based on a delay-amount control signal being generated from delay-amount control means for generating a delay-amount control signal for controlling, depending on variations of the signal-delay amount that are detected by detecting means for detecting the variations of the amount delayed by the DLL circuit.

According to the invention, a semiconductor circuit includes a DLL circuit for supplying a desired signal-delay amount, wherein the DLL circuit includes detecting means for detecting variations of the signal-delay amount, and delay-amount control means for generating a delay-amount control signal for controlling, depending on the variations of the signal-delay amount detected by the detecting means, the signal-delay amount of the DLL circuit; and the semiconductor circuit further includes means for monitoring circuit performance of the semiconductor circuit based on the delay-amount control signal.

The semiconductor circuit as described above enables implementing process monitoring and product screening without obtaining detailed process data from the semiconductor manufacturer as a delay-amount control signal (DLI) of a DLL is used in CMOS process monitoring and product screening using a digital DLL. Moreover, not requiring implementing speed testing of measurement, etc., of the oscillating frequency of the ring oscillator enables implementing process monitoring and product screening operations as a part of functional testing.

According to another aspect of the invention, a method of monitoring circuit performance of a semiconductor circuit, which includes a DLL circuit for supplying a desired signal-delay amount, includes the step of monitoring the circuit performance of the semiconductor circuit based on a delay-amount control signal generated by delay-amount control means for generating the delay-amount control signal for controlling, depending on variations of a signal-delay amount detected by detecting means for detecting the variations of the signal-delay amount by the DLL circuit, the signal-delay amount of the DLL circuit.

The method of monitoring circuit performance of the semiconductor circuit as described above enables implementing process monitoring and product screening without obtaining detailed process data from the semiconductor manufacturer as a delay-amount control signal (DLI) of a DLL is used in CMOS process monitoring and product screening using a digital DLL. Moreover, not requiring implementing speed testing of measurement, etc., of the oscillating frequency of the ring oscillator enables implementing process monitoring and product screening operations as a part of functional testing.

According to another aspect of the invention, a method of testing circuit performance of a semiconductor circuit which includes a DLL circuit for supplying a desired signal-delay amount includes the step of determining whether the semiconductor circuit is good by determining the circuit performance of the semiconductor circuit based on a delay-amount control signal generated by delay-amount control means for generating the delay-amount control signal for controlling, depending on variations of a signal-delay amount detected by detecting means for detecting the variations of the signal-delay amount by the DLL circuit, the signal-delay amount of the DLL circuit.

The method of testing circuit performance of the semiconductor circuit as described above enables implementing process monitoring and product screening without obtaining detailed process data from the semiconductor manufacturer as delay-amount control signal (DLI) of a DLL is used in a CMOS process monitoring and product screening using a digital DLL. Moreover, not requiring implementing speed testing of measurement, etc., of the oscillating frequency of the ring oscillator enables implementing process monitoring and product screening operations as a part of functional testing.

According to another aspect of the invention, an equipment for testing circuit performance of a semiconductor circuit including a DLL circuit for supplying a desired signal-delay amount includes determining means for determining whether the semiconductor circuit is good by determining the circuit performance of the semiconductor circuit based on a delay-amount control signal generated by delay-amount control means for generating the delay-amount control signal for controlling, depending on variations of a signal-delay amount detected by detecting means for detecting the variations of the signal-delay amount by the DLL circuit, the signal-delay amount of the DLL circuit.

The equipment for testing circuit performance of the semiconductor circuit as described above enables implementing process monitoring and product screening without obtaining detailed process data from the semiconductor manufacturer as a delay-amount control signal (DLI) of a DLL is used in CMOS process monitoring and product screening using a digital DLL. Moreover, not requiring implementing speed testing of measurement, etc., of the oscillating frequency of the ring oscillator enables implementing process monitoring and product screening operations as a part of functional testing.

According to another aspect of the invention, a program includes instructions for causing a computer to execute a process of testing performance of a semiconductor circuit which includes a DLL circuit for supplying a desired signal-delay amount, the instructions including instructions for determining whether the semiconductor circuit is good by determining the performance of the semiconductor circuit based on a delay-amount control signal generated by delay-amount control means for generating the delay-amount control signal for controlling, depending on variations of a signal-delay amount detected by detecting means for detecting the variations of the signal-delay amount by the DLL circuit, the signal-delay amount of the DLL circuit.

The program as described above enables implementing process monitoring and product screening without obtaining detailed process data from the semiconductor manufacturer as a delay-amount control signal (DLI) of a DLL is used in CMOS process monitoring and product screening using a digital DLL. Moreover, not requiring implementing speed testing of measurement, etc., of the oscillating frequency of the ring oscillator enables implementing process monitoring and product screening operations as a part of functional testing.

Other objects and further features of the present invention will become apparent from the following detailed description when read in conjunction with the accompanying drawings.

DETAILED DESCRIPTION OF THE PREFERRED EMBODIMENTS

In the following, embodiments of the present invention are described with reference to the accompanying drawings.

Before describing the embodiments of the present invention, a DLL circuit for applying in the present invention is described.

In an ASIC using a DDR (Double-Data Rate) memory interface for example, when taking read data (DQ) from the memory using a read data strobe (DQS) signal having the clock period T, the phase of the turning point of the DQS signal coincides with that of the turning point of the DQ signal, and the DQ signal changes every T/2. Therefore, in order to accurately read the DQ signal in the ASIC, a T/4 delay needs to be applied to the DQS signal. A DLL (Delayed Locked Loop) circuit is used for applying a high-precision delay to a random clock period T.

Especially in a environment requiring high-precision data processing, high-precision delay-amount control is called for as the precision of the delay-amount control by this DLL circuit greatly impacts the performance of the LSI circuit itself. Thus in order to implement high-precision delay-amount control, high-precision performing of detecting a delay amount generated by the DLL circuit concerned is required. In other words, there is a need to detect, with high precision, variations in the delay amount due to process variations so as to compensate for the detected variations. Conversely, it can be said that the delay-amount control signal generated by a DLL circuit which satisfies such condition reflects, with high precision, variations in the circuit performance of a semiconductor element configuring the DLL circuit.

Figure 2A:
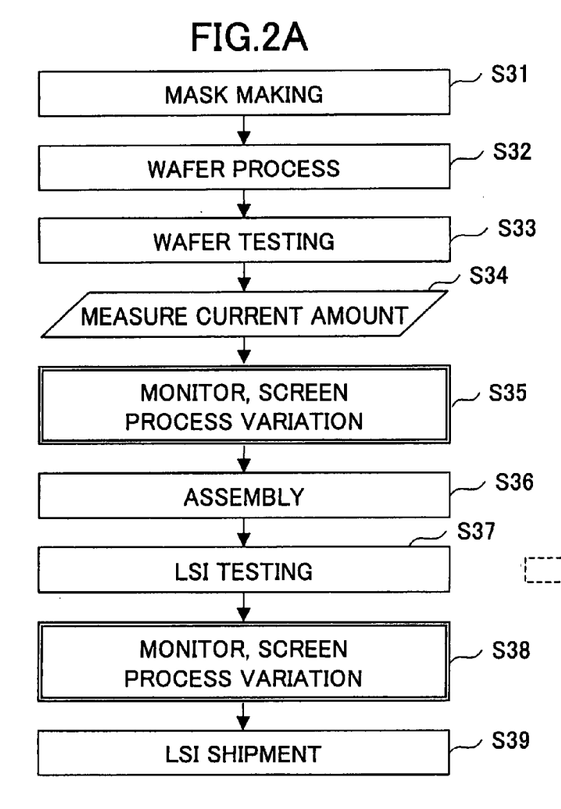
FIG. 2A and FIG. 2B are diagrams for describing a method of testing and screening a semiconductor circuit according to one embodiment of the present invention.
Figure 2B:
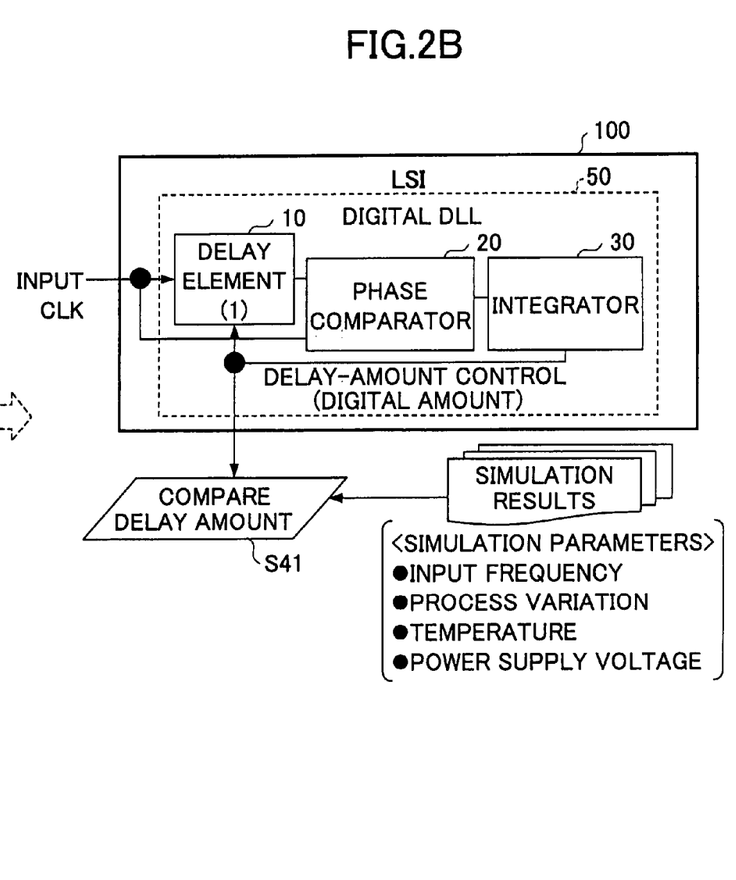

FIG. 2A and FIG. 2B, diagrams corresponding to FIG. 1 as described above, are for describing a method of monitoring and testing a semiconductor circuit according to one embodiment of the invention.

FIG. 2A illustrates an overall process of manufacturing a semiconductor up to product shipment, in which a mask for manufacturing the semiconductor is manufactured in step S31, the mask is used to manufacture a semiconductor wafer in step S32, and the manufactured wafer is tested in step S33. More specifically, the current amount of the semiconductor circuit in the manufactured wafer is measured in step S34, and an inspecting of process variations and a product screening using the inspected results are performed in step S35. Still more specifically, the circuit performance of the semiconductor circuit is analyzed and evaluated from the current amount measured in step S34 so as to collate the evaluated results with predetermined product shipment standards for discarding an out-of-spec product as a result of the collating.

Next in step S36, for a product for which the evaluated results are within-spec, assembling of the LSI circuit is performed. In step S37, for such an assembled LSI circuit, product testing (a function test, etc.) is performed.

In the product testing of this step S37, inspecting of process variations of the LSI circuit is performed using a delay-amount control signal of a DLL circuit 50, with a method of testing a semiconductor circuit according to an embodiment of the invention. FIG. 2B illustrates a block diagram of an embedded DLL-circuit portion out of the LSI circuit 100 inspected. As illustrated, the DLL circuit 50 being embedded in the LSI circuit inspected includes a delay element 10, a phase comparator 20 for comparing the phase of the input of the delay element 10 and the phase of the output of the delay element 10, and an integrator 30 as a delay controller for controlling the amount of delay by the DLL circuit 50 by integrating the compared results by the phase comparator and controlling the number of unit-delay element stages actually applied in the delay element 10 depending on the integrated results.

In the embodiment of the present invention, in step S41, the delay-amount control signal for controlling the number of unit-delay element stages applied is taken from the delay controller (the integrator) 30 so as to compare the taken value with a standard value derived in advance by a simulation. In other words, as described above, the delay-amount control signal generated from the delay controller 30 is compared with the simulation value of the delay-amount control signal for the product concerned obtained in advance by the simulation.

This simulation value, as described below, is the tolerance for the delay-amount control signal value regarding the product concerned that is derived per condition according to simulation parameters consisting of the input frequency (the clock frequency), the process variation value, the temperature, and the power supply voltage. Then, the delay-amount control signal value in the condition as described above is obtained by determining with an actual measurement, etc., the actual values, other than the process variation value, of the simulation parameters as described above at the timing of testing so as to compare the obtained tolerance with the delay-amount control signal value obtained from the DLL circuit of the tested LSI circuit actually measured for determining, when the actual values are out-of-tolerance, that the tested LSI circuit is an out-of-spec product so as to discard the LSI (step S38). If the compared results are within-tolerance, shipment of the LSI is made in step S39.

Figure 8:
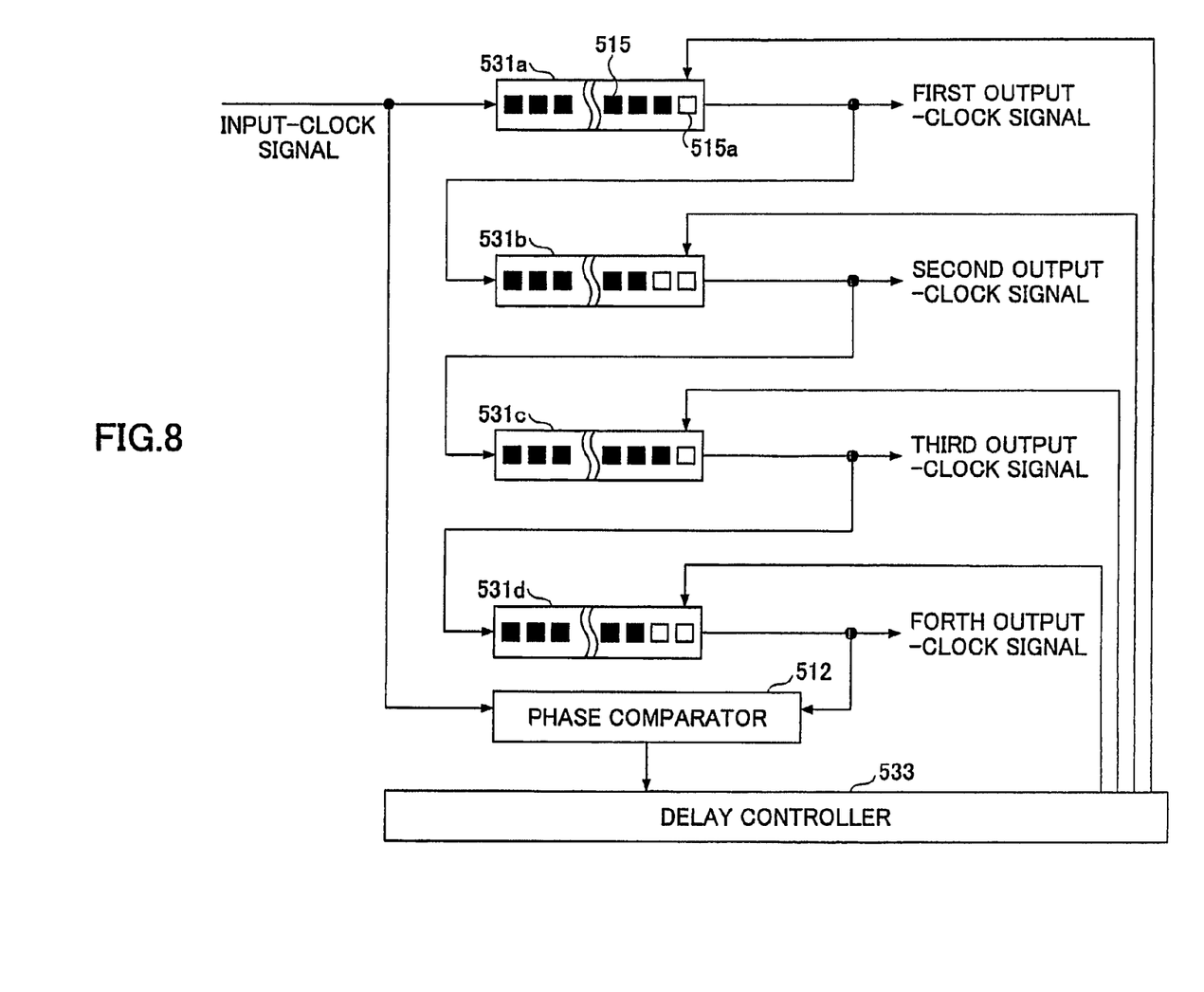
FIG. 8 is a diagram for describing a digital DLL circuit applicable to a semiconductor circuit according to one embodiment of the invention.
Figure 9:
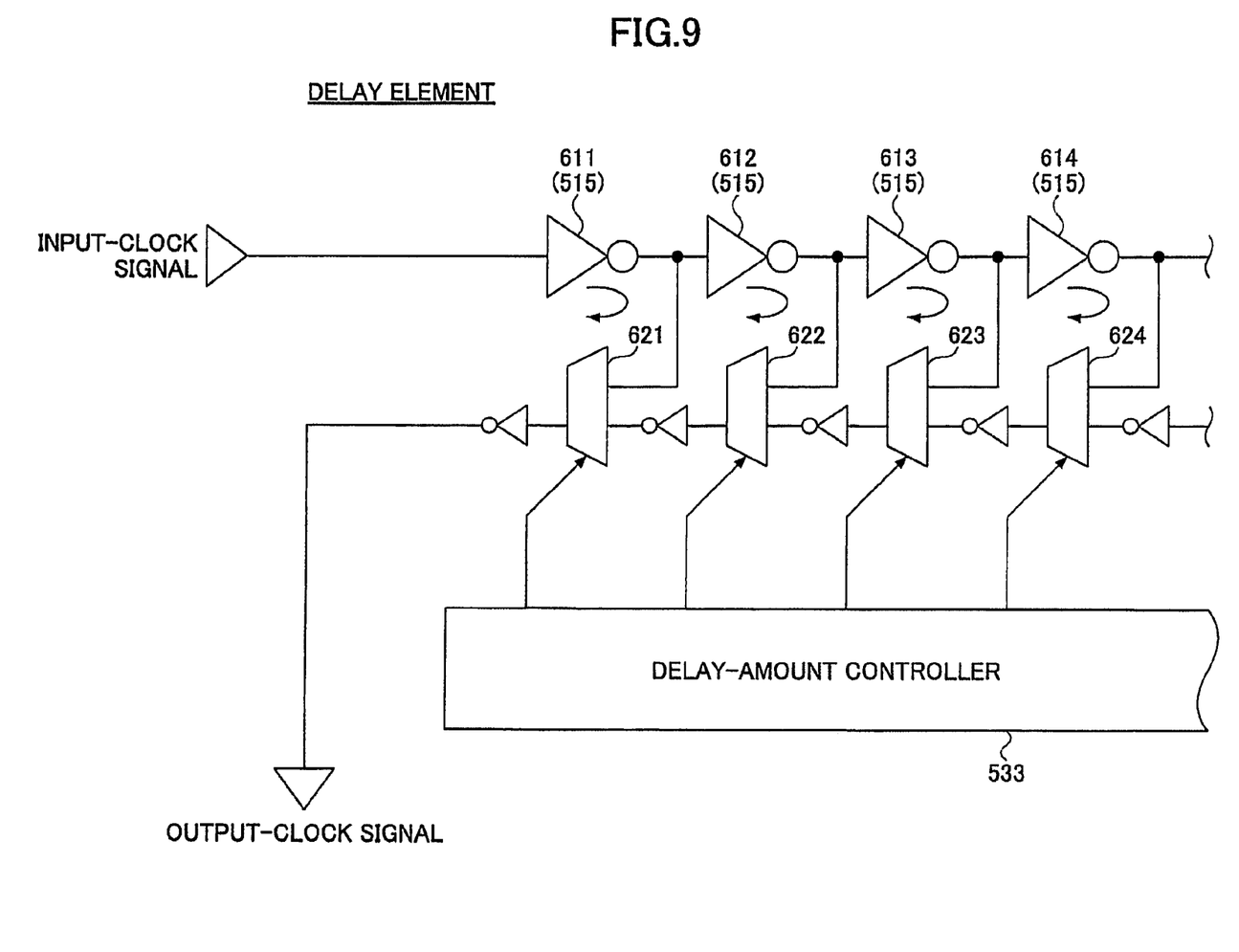
FIG. 9 is an exemplary configuration of a delay element within the digital DLL circuit as illustrated in FIG. 8.

In the embodiment of the present invention, a digital DLL having a configuration as described below in conjunction with FIG. 8 and FIG. 9 is envisaged as a DLL circuit 50 (FIG. 2B) to be applied, and, more specifically, a configuration as follows is envisaged for this digital DLL circuit.

In other words, as for the delay element as means for generating the delay amount of the DLL circuit, having to sequentially connect a large number of stages of unit-delay elements each having a small unit-delay time (inverters 611, 612, 613, 614, etc. for FIG. 9) and to automatically adjust the number of stages enable performing, in FIG. 2B, a control causing the total time delayed by the delay element 10 portion to correspond with the period of the input signal. In other words, in an example in FIG. 8, a control is performed such that a total of the amount delayed by each of the variable delay units 531a, 531b, 531c, 531d configuring the delay element 10 is caused to coincide with the period T of the input clock signal.

As the value of the DLI (delay-amount control signal) for adjusting this number of stages of the unit-delay elements is determined by the input frequency, the process variations, the temperature, and the power supply voltage, conversely, having to set the input frequency, the temperature, and the power supply voltage to a certain condition enables obtaining a delay-amount control signal that is dependent on the process variations. Therefore, having to compare the value of the delay-amount control signal as the actual output value of the LSI circuit with the simulation value obtained in a simulation with a multiple number of conditions having the input frequency, the temperature, and the power supply voltage as parameters enables monitoring the process variations in the semiconductor circuit and using the evaluation results for product screening.

Below, specific examples of the simulation as described above are described in conjunction with FIG. 3 and FIG. 4.

Figure 3:
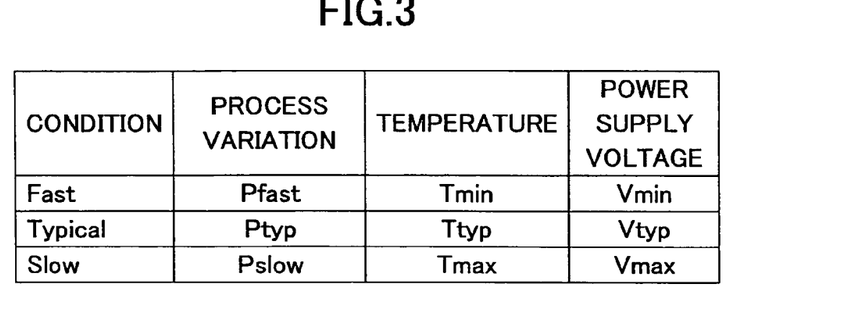
FIG. 3 is a table illustrating delay-time conditions applied in the testing of the semiconductor circuit as illustrated in FIG. 2A and FIG. 2B.

Generally, the delay time of a LSI circuit is uniquely determined by the power supply voltage, the temperature, and the process variations. The delay time in the recommended operating conditions as illustrated in FIG. 3 falls within the range between the Fast condition and the Slow condition. Here the Fast condition is a condition such that the delay time of the LSI circuit reaches the minimum while the Slow condition is a condition such that the delay time reaches the maximum. Such variations over a predetermined range in the circuit performance of a LSI circuit product are due to deviations in various manufacturing conditions in the semiconductor manufacturing process of steps S31 and S32 in FIG. 2 as described above, the circuit performance variations thus being specific to individual products.

Figure 4:
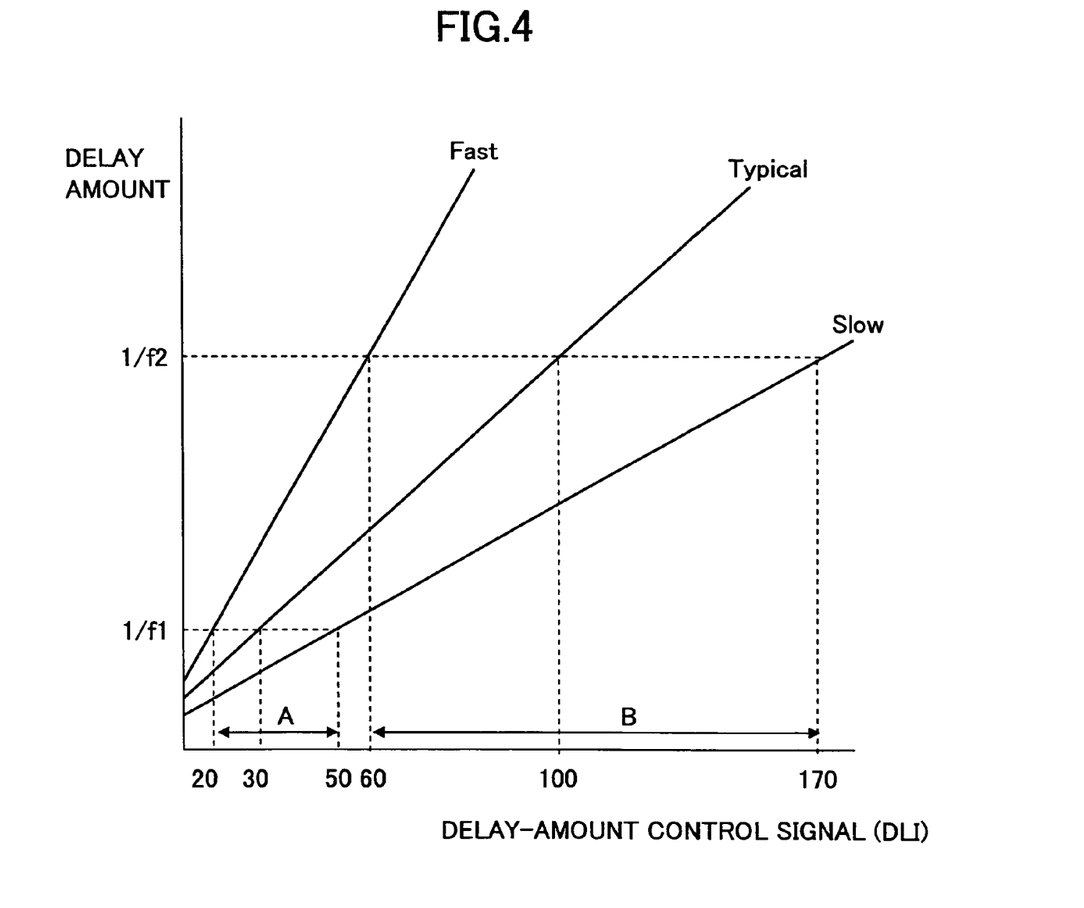
FIG. 4 is a graph illustrating an exemplary result of a simulation for deriving criteria for determining a delay-control signal applied in semiconductor testing according to one embodiment of the present invention.

In conjunction with FIG. 4, the simulation results of the delay-amount control signal as well as the screening range (the range for a criteria of good-parts decision) are discussed. In the graph illustrated, the vertical axis represents the delay time generated by the delay element 10, while the horizontal axis represents the delay-amount control signal (DLI). The illustration shows the circuit performance of the LSI circuit according to each of the conditions of Fast, Typical (a standard condition), and Slow.

As the delay time of the delay element 10 on the vertical axis is an inverse of the frequency (f) of the clock signal (CLK) input to the DLL circuit 50, determining the clock frequency for inputting into the DLL circuit enables computing the amount of delay-amount control signal in each of the Fast, Typical, and Slow conditions.

The exemplary computations of the value of the delay-amount control signal when using the simulation values of FIG. 4 are described below.

Assume that f1 as the maximum frequency of the clock signal lockable by the DLL circuit 50 and f2 as the minimum frequency result in the range of frequencies lockable by the DLL circuit 50 being f1 through f2 (or the usage range). Here, the delay control signal values at f1 at the higher side of the frequency range may be computed, in FIG. 4, as 20 with the Fast condition, 30 with the Typical condition, and 50 with the Slow condition, instance. Therefore, the frequency f1 of the clock input into the DLL circuit 50 results in the delay-amount control signal value varying over a range A of between 20 and 50 among product lots of the LSI circuit. In other words, the tolerance in this case becomes the range A.

Similarly, f2 at the lower side of the frequency range results in a range B between 60 and 170 so that, in this case, the range B becomes the tolerance of the variation of delay-amount control signal values.

Therefore, in this case, having to establish screening decision criteria A and B that are dependent on the input clock frequency at the time of the shipment testing of the LSI circuit enables screening a product falling within this range as a good product. Then, as the delay-amount control signal may be computed as a digital value, contrary to the case of implementing the frequency measurement as in step S8 of FIG. 1A, implementing the screening operation as a part of the functional test of the LSI (step S37 in FIG. 2A) is enabled. In other words, having to derive the product screening criteria as described above so as to compare the derived criteria with the actual measured value enables product evaluation, and as the delay-amount control signal as described above is a signal for determining the number of stages of the unit-delay elements that are actually applied in the delay element 10 and is generated as a digital signal, the screening operation itself can be implemented as a digital-signal processing.

Figure 5:
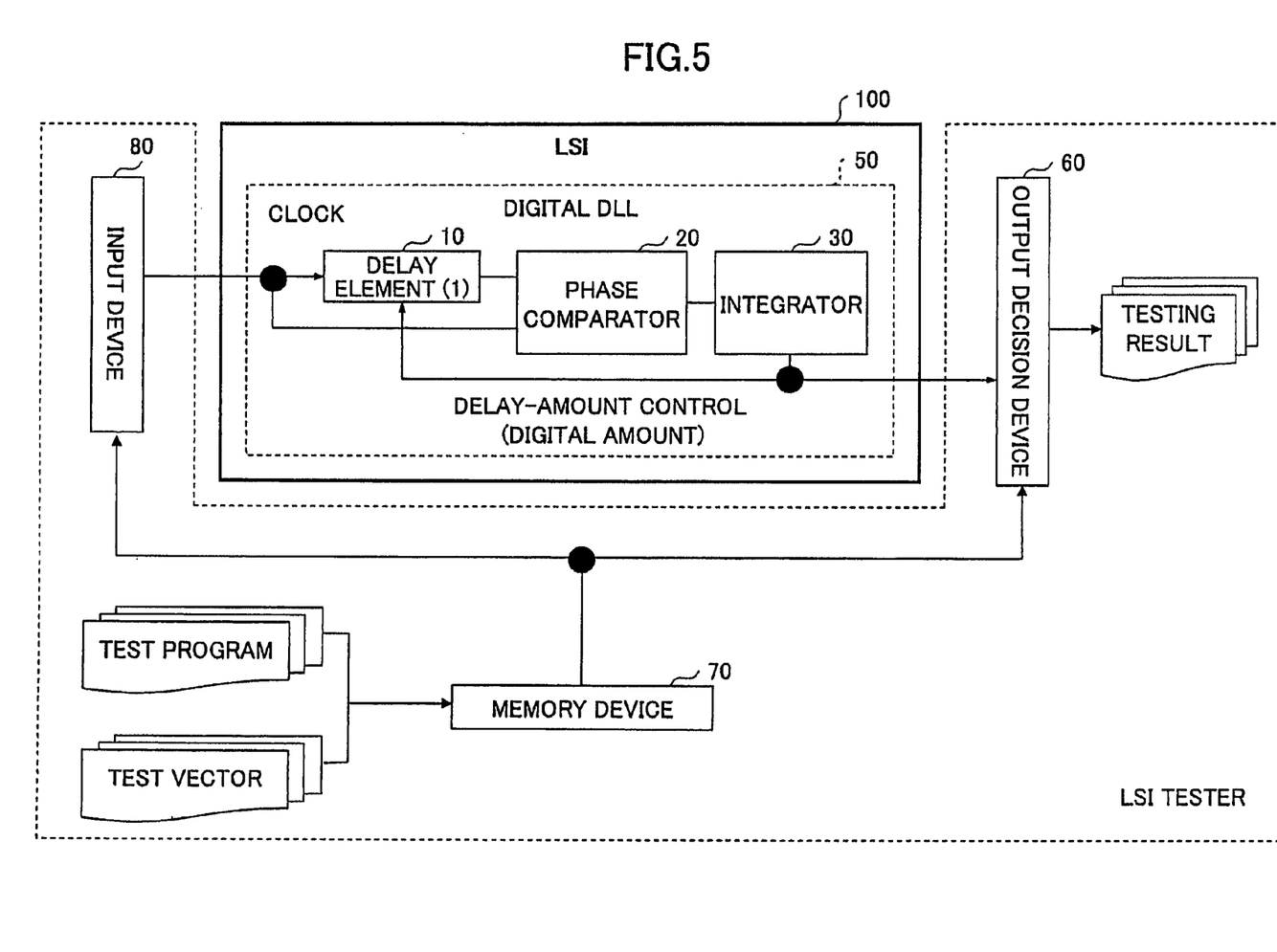
FIG. 5 is a block diagram for describing a mode of testing by a semiconductor-testing equipment according to one embodiment of the present invention.
Figure 6:
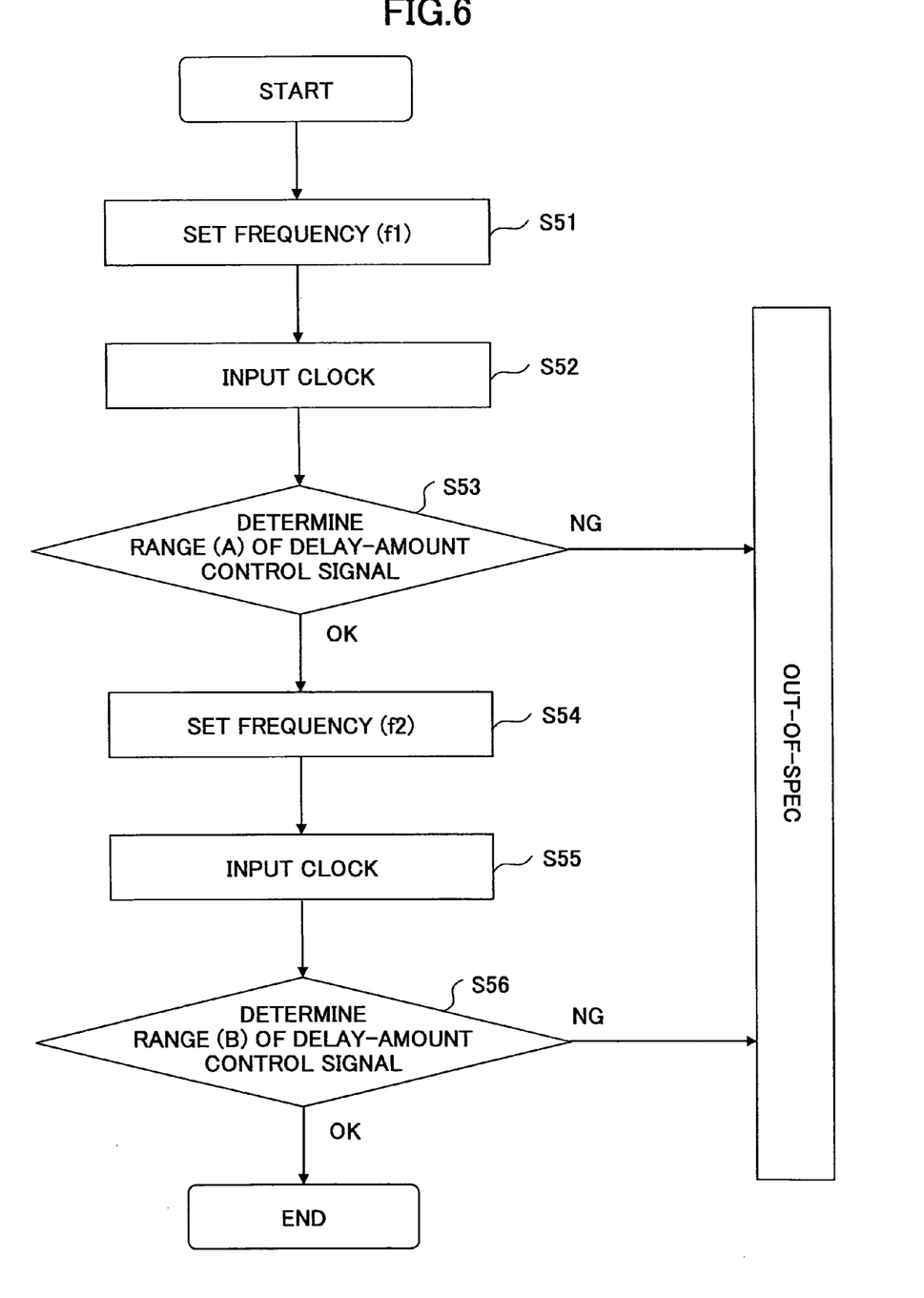
FIG. 6 is an operations flowchart for a method of the testing by the semiconductor-testing equipment as illustrated in FIG. 5.

FIG. 5 is a block diagram for describing a technique for testing and product screening of a semiconductor circuit by a LSI tester, while FIG. 6 illustrates an operations flowchart in such a case. This testing technique using the LSI tester is applicable for the LSI testing of the step S37 illustrated in conjunction with FIG. 2B as described above.

The LSI tester illustrated in FIG. 5 has a memory device 70 for storing testing conditions according to the simulation values as described above, an input device 80 for applying to the DLL circuit 50 of a LSI 100 under test the clock signal according to the frequency value of the input clock signal as the testing condition stored in the memory device 70, and an output-decision device 60 for receiving the delay-amount control signal generated by the DLL circuit 50 of the tested LSI 100 so as to compare the received value with the product screening criteria values depending on the applicable testing conditions stored in the memory device 70 for evaluating and outputting the evaluating results.

In conjunction with FIG. 6, a method of semiconductor testing by the LSI tester illustrated in FIG. 5 is described.

In step S51, a frequency f1 at the higher side is set so as to apply a clock signal having this frequency to the DLL circuit 50 of the tested LSI circuit (step S52). In step S53, it is determined whether the delay-amount control signal value generated by the delay controller 30 of the DLL circuit 50 in this case is within the screening range A (FIG. 4) as described above. When the determined result is "out-of-range" the tested LSI circuit concerned is determined to be out-of-spec while when the determined result is "within range", the operations proceed to step S54.

In step S54, the frequency f2 at the lower side is set so as to apply the clock signal having this frequency to the DLL circuit 50 of the LSI circuit tested (step S55). In step S56, it is determined whether the delay-amount control signal value generated by the delay controller 30 of the DLL circuit 50 in this case falls within the screening range B (FIG. 4) as described above. When the determined result is "out-of-range", the tested LSI circuit concerned is determined to be out-of-spec, while when the determined result is "within range" this operation is completed. In this case the tested LSI circuit concerned is determined to be a good product.

It is noted that in the above testing the temperature and the power supply voltage as the other simulation parameters are measured in advance so that the screening range A or B depending on the measured results is applied.

Figure 7:
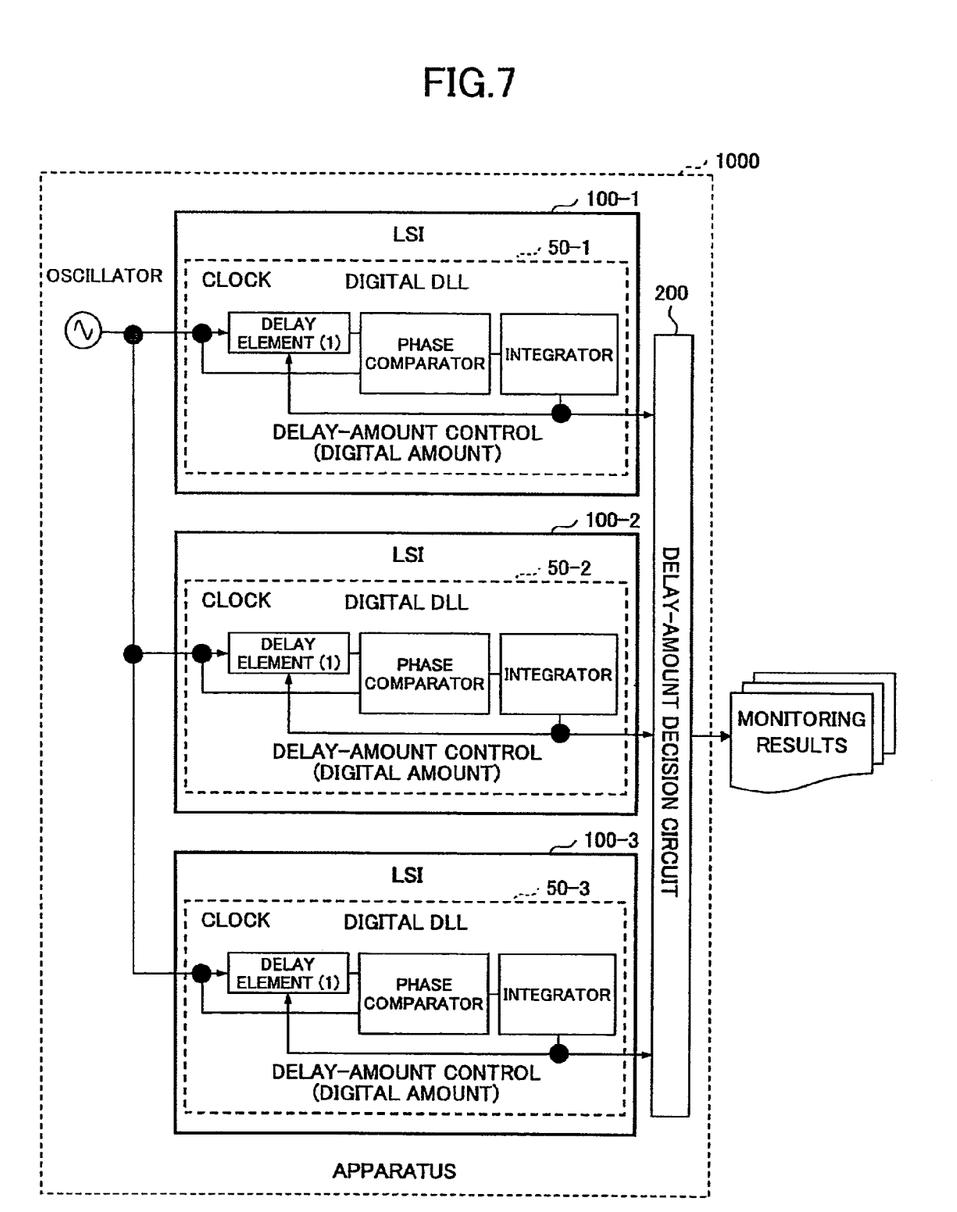
FIG. 7 is a block diagram for a LSI-circuit device including a function of monitoring the semiconductor performance according to one embodiment of the present invention.

Moreover, even after the LSI circuit concerned is determined as a good product as a result of the screening testing as described above, resulting in actually having mounted the circuit on the device, having to monitor the delay-amount control signal of that DLL circuit 50 enables determining variations among individual LSI circuit units. FIG. 7 is a diagram for describing a method of monitoring the performance of a LSI circuit in a device having mounted 3 chips of LSI circuits.

As illustrated, the device has three sets of LSI circuits 100-1, 100-2, 100-3 as well as a delay-amount decision circuit 200. This delay-amount decision circuit 200 receives the delay-amount control signals generated by each of the delay controllers 30 of the DLL circuits 50-1, 50-2, 50-3 of the LSI circuits so as to output the received values as monitoring results. In this case, as needed, the outputting may be made after having performed the computations for product evaluation. It is noted that in this case, the principle of detecting, from the value of the delay-amount control signal generated by the delay controller 30 of the DLL circuit 50, the circuit performance of the LSI circuit including the DLL circuit is the same as the principle of evaluation in the LSI circuit testing and product screening at the time of the product shipment as described above.

It is noted that what is actually detected in the testing at the time of product shipment of the LSI circuit and the process monitoring at the time of mounting onto an actual device of the LSI circuit, as described above, is the circuit performance of the semiconductor element being the delay element 10 configuring the DLL circuit 50 included in the LSI circuit 100 concerned. However, in the manufacturing process in FIG. 2A, as the LSI circuit 100 is manufactured under the same manufacturing condition, the variations of the performance are considered to have the same values within the LSI circuit. Therefore, detecting the circuit performance of the delay element 10 of the DLL circuit included in the LSI circuit 100 may be considered equivalent to having detected the circuit performance for the overall LSI circuit including the DLL circuit.

Moreover, each of the operations of testing at the time of product shipment of the LSI circuit as described above (FIG. 2 and FIG. 5, etc.) and monitoring at the time of mounting the LSI circuit onto the actual device (FIG. 7) can be implemented by using a program consisting of instructions causing a computer to execute the method, and causing the computer to execute the programs. The program in this case is loaded into the computer, for example, via a portable recording medium such as a CD-ROM or via a communications network such as the Internet.

Below, in conjunction with FIG. 8 and FIG. 9, a DLL circuit (a digital DLL) 50 applicable to the embodiment of the present invention is described in detail.

FIG. 8 is a principle block diagram illustrating a digital DLL circuit applicable as the DLL circuit 50 embedded in the tested or monitored LSI circuit 100 in the embodiment of the present invention as illustrated in FIG. 2B, etc., while FIG. 9 illustrates an exemplary circuit configuration of any one of variable-delay units 531a, 531b, 531c and 531d in FIG. 8. In FIG. 8, the four variable-delay units 531a through 531d correspond to the delay unit 10 in FIG. 2B, with a phase comparator 512 corresponding to the phase comparator 20 in FIG. 2B and a delay controller 533 corresponding to the integrator in FIG. 2B.

The digital DLL circuit illustrated in FIG. 8 receives an input clock signal so as to sequentially delay the received signal at the four serially-connected variable-delay units 531a through 531d, while a first output-clock signal is taken from the first variable-delay unit 531a, a second output-clock signal is taken from the second variable-delay unit 531b, a third output-clock signal is taken from the third variable-delay unit 531c, and a fourth output-clock signal is taken from the fourth variable-delay unit 531d.

Each of these four variable-delay units 531a through 531d causes a delay of a quarter of a period, or T/4, relative to the period T of the input clock signal, results in the first through the fourth output-clock signals taken from these delay units to be delayed T/4, 2T/4, 3T/4, 4T/4 respectively from the input-clock signal. The delayed clock signals thus obtained are supplied to other functional units within the LSI circuit as DQS(read data strobe) signals, for example.

Then in the phase comparator 512, a comparison between the phase of the input-clock signal and the phase of the fourth output-clock signal is performed so as to output to a delay controller 533 a phase-difference signal of 0 (zero) when the phase difference is 4T/4 or there is a correspondence in the phases, and to output when there is a difference between the phases of both signals a phase-difference signal representing the difference to the delay controller 533.

In the delay controller 533, depending on the phase-difference signal obtained from the phase comparator 512, for each of the variable-delay units 531a through 531b, the number of stages of unit-delay elements actually applied in each variable-delay unit is controlled. More specifically, when the phase of the fourth output-clock signal leads in relation to the phase of the input-clock signal, a control is performed such that the total number of stages of the number of stages of unit-delay elements applied to each of the four variable-delay units 531a through 531d is increased, while when the phase of the fourth output-clock signal lags behind in relation to the phase of the input-clock signal, a control is performed such that the total number of stages as described above is decreased. As a result, the total amount of delay by the four units of variable delay 531a through 531d is controlled such that the amount corresponds to the period T of the clock signal, and therefore the delay amount of each of the variable-delay units corresponds to T/4.

In FIG. 8, in each variable-delay unit, a blackened square 515 represents a unit-delay element actually being applied, while a whitened square 515a represents a unit-delay element not being applied. These unit-delay elements, as illustrated in FIG. 9, consist of inverters 611, 612, 613, 614, . . . , the delay controller 533 controlling how many of those stages of unit-delay elements to apply.

More specifically, only a selector, out of selectors 621, 622, 623, 624, . . . , corresponding to the loop-back position at the number of stages applied selects the output of the inverter as the unit-delay element as described above while for the other selectors, side of the previous stage is selected for the other selectors 621, 622, 624, . . . . For example, with FIG. 9, assuming, the number of stages of applied unit-delay elements as 3 or only the inverters 611, 612, and 613 are applied, a delay-amount control signal is applied from the delay-amount controller 533 such that the inverter side as the unit-delay element is selected and the selector side of the previous stage is selected for the other selectors 621, 622, 624, . . . .

The present application is based on Japanese Priority Application No. 2004-250782 filed Aug. 30, 2004, with the Japanese Patent Office, the entire contents of which are hereby incorporated by reference.

What is claimed is:

1. A semiconductor circuit, comprising:
   a DLL circuit for supplying a desired signal-delay amount;
   wherein said DLL circuit includes
      a phase comparator for detecting variations in a signal-delay amount; and
      an integrator for generating a delay-amount control signal for controlling, depending on the variations in the signal-delay amount detected by the phase comparator, the signal-delay amount of the DLL circuit;
   wherein the semiconductor circuit further includes
      an output-decision device for comparing the delay-amount control signal generated by the DLL circuit with a standard value derived in advance by a simulation so as to determine whether the semiconductor circuit is good.

2. A method of monitoring circuit performance of a semiconductor circuit which includes a DLL circuit for supplying a desired signal-delay amount, comprising the steps of:
   monitoring the circuit performance of the semiconductor circuit based on a delay-amount control signal generated by an integrator for generating the delay-amount control signal for controlling, depending on variations of a signal-delay amount detected by a phase comparator for detecting the variations of the signal-delay amount of the DLL circuit, the signal-delay amount of the DLL circuit; and
   comparing the delay-amount control signal generated by the DLL circuit with a standard value derived in advance by a simulation so as to determine whether the semiconductor circuit is good.

3. A method of testing circuit performance of a semiconductor circuit which includes a DLL circuit for supplying a desired signal-delay amount, comprising the steps of:
   determining the circuit performance of the semiconductor circuit based on a delay-amount control signal generated by an integrator for generating the delay-amount control signal for controlling, depending on variations of a signal-delay amount detected by a phase comparator for detecting the variations of the signal-delay amount of the DLL circuit, the signal-delay amount of the DLL circuit; and
   comparing the delay-amount control signal generated by the DLL circuit with a standard value derived in advance by a simulation so as to determine whether the semiconductor circuit is good.

4. An apparatus for testing circuit performance of a semiconductor circuit including a DLL circuit for supplying a desired signal-delay amount, comprising:

determining means for determining the circuit performance of the semiconductor circuit based on a delay-amount control signal generated by an integrator for generating the delay-amount control signal for controlling, depending on variations of a signal-delay amount detected by a phase comparator for detecting the variations of the signal-delay amount of the DLL circuit, the signal-delay amount of the DLL circuit; and an output-decision device for comparing the delay-amount control signal generated by the DLL circuit with a standard value derived in advance by a simulation so as to determine whether the semiconductor circuit is good.

5. A computer readable medium encoded with a computer program comprising:

instructions for causing a LSI tester to execute a process of testing performance of a semiconductor circuit which includes a DLL circuit for supplying a desired signal-delay amount, the process including:

a step for determining whether the semiconductor circuit is good by determining the circuit performance of the semiconductor circuit based on a delay-amount control signal generated by an integrator for generating the delay-amount control signal for controlling, depending on variations of a signal-delay amount detected by a phase comparator for detecting the variations of the signal-delay amount of the DLL circuit, the signal-delay amount of the DLL circuit; and comparing the delay-amount control signal generated by the DLL circuit with a standard value derived in advance by a simulation so as to determine whether the semiconductor circuit is good.

* * * * *